US005500995A

United States Patent [19]

Palmieri et al.

[11] Patent Number: 5,500,995

[45] Date of Patent: Mar. 26, 1996

[54] METHOD OF PRODUCING RADIOFREQUENCY RESONATING CAVITIES OF THE WELDLESS TYPE

[75] Inventors: Vincenzo Palmieri; Renato Preciso; Vladimir L. Ruzinov; Sergei Y. Stark; Il'Ya I. Kulik, all of Legnaro, Italy

[73] Assignee: Istituto Nazionale Di Fisica Nucleare, Frascati, Italy

[21] Appl. No.: 147,595

[22] Filed: Nov. 5, 1993

[30] Foreign Application Priority Data

Jun. 14, 1993 [EP] European Pat. Off. .............. 93830260

[51] Int. Cl.$^6$ ...................................................... H01L 39/24

[52] U.S. Cl. .................................. 29/599; 29/600; 72/478

[58] Field of Search ..................... 29/599, 600; 505/928; 333/227; 72/82, 83, 478

[56] References Cited

U.S. PATENT DOCUMENTS

| | | | |
|---|---|---|---|
| 264,150 | 9/1882 | Grom | 72/478 |
| 693,186 | 2/1902 | Sweet | 72/478 |
| 1,565,015 | 12/1925 | Koellner | 72/478 |
| 1,921,584 | 8/1933 | Robinson | 72/478 |
| 4,115,916 | 9/1978 | Meyerhoff | 29/600 |
| 4,765,055 | 8/1988 | Ozaki et al. | 29/599 |

FOREIGN PATENT DOCUMENTS

| | | | |
|---|---|---|---|
| 0527713 | 2/1993 | European Pat. Off. . | |
| 3722745 | 1/1989 | Germany . | |
| 60-261203 | 12/1985 | Japan . | |
| 60-261202 | 12/1985 | Japan . | |
| 61-39602 | 2/1986 | Japan . | |
| 1692302A3 | 11/1991 | U.S.S.R. | 72/82 |
| 9001859 | 2/1990 | WIPO . | |

OTHER PUBLICATIONS

P. Kneisel et al, Letters to the Editor; First Results on Elliptically Shaped Cavities, Nuclear Inst. & Methods in Physics Research, vol. 188 (1981), Amsterdam.

C. Benvenuti et al, Superconducting Niobium SputterCoated Copper Cavity Modules for the LEP Energy Upgrade; 1991 IEEE Conference Record, pp. 1023–1025.

J. Kirchgessner et al, Fabrication of Superconducting Biobium Radio Frequency Structures, 8100 IEEE Transactions on Nuclear Sci., vol. NS–30 (1983), NY, USA.

*Primary Examiner*—David P. Bryant
*Attorney, Agent, or Firm*—Robert S. Lipton; Lipton & Stapler

[57] ABSTRACT

A method of producing weldless resonating monolithic cavity comprising the steps of: arranging a die which can be disassembled into sectors and having the form of the internal cavity of the resonator; spinning a foil by using said die so as to provide a monolithic weldless body of metal sheet which coats exactly and completely the die; and disassembling and removing the sectors of the die through one opening of the resonator.

7 Claims, 9 Drawing Sheets

METHOD OF PRODUCING RADIOFREQUENCY RESONATING CAVITIES OF THE WELDLESS TYPE

The present invention relates to a method of producing radiofrequency resonating cavities of the weldless type. This invention also relates to the monolithic accelerating cavity obtained from such method.

At the present state of art, the accelerating cavities both of bulk niobium and niobium-sputtered OFHC copper are commonly fabricated by lathe spinning or deep drawing the half cells of the resonator which are then electron beam welded from the interior, Because of the size of the electron beam deflection magnet the welding from the interior is a severe limitation to the use of this technique applied to high frequency resonating cavities besides further drawbacks such as the residual radiofrequency power loss in the superconducting layer due to any welding defect.

The new generation of superconducting accelerators need high quality particle beams to be collided in to one another at energy levels which cannot be reached without the aid of superconducting cavities, Development of high gradient accelerating fields near the thoretical limit is needed in resonating accelerating structures operating between 1.5 and 3 GHz.

The development of an optimized inner resonator surface is necessary for providing high accelerating fields; large investments in several industries and laboratories are employed at present in that development.

The object of the invention is to provide a method of producing resonating cavities with one or more weldless cells in a technically and economically convenient manner.

The object according to the invention is achieved by extending the half cell spinning method to the whole cavity onto a suitable die which can be disassembled under control.

This invention will now be described with reference to the accompanying drawings showing by way of an illustrative, non-limitative example a preferred embodiment of the invention.

Figure 1:
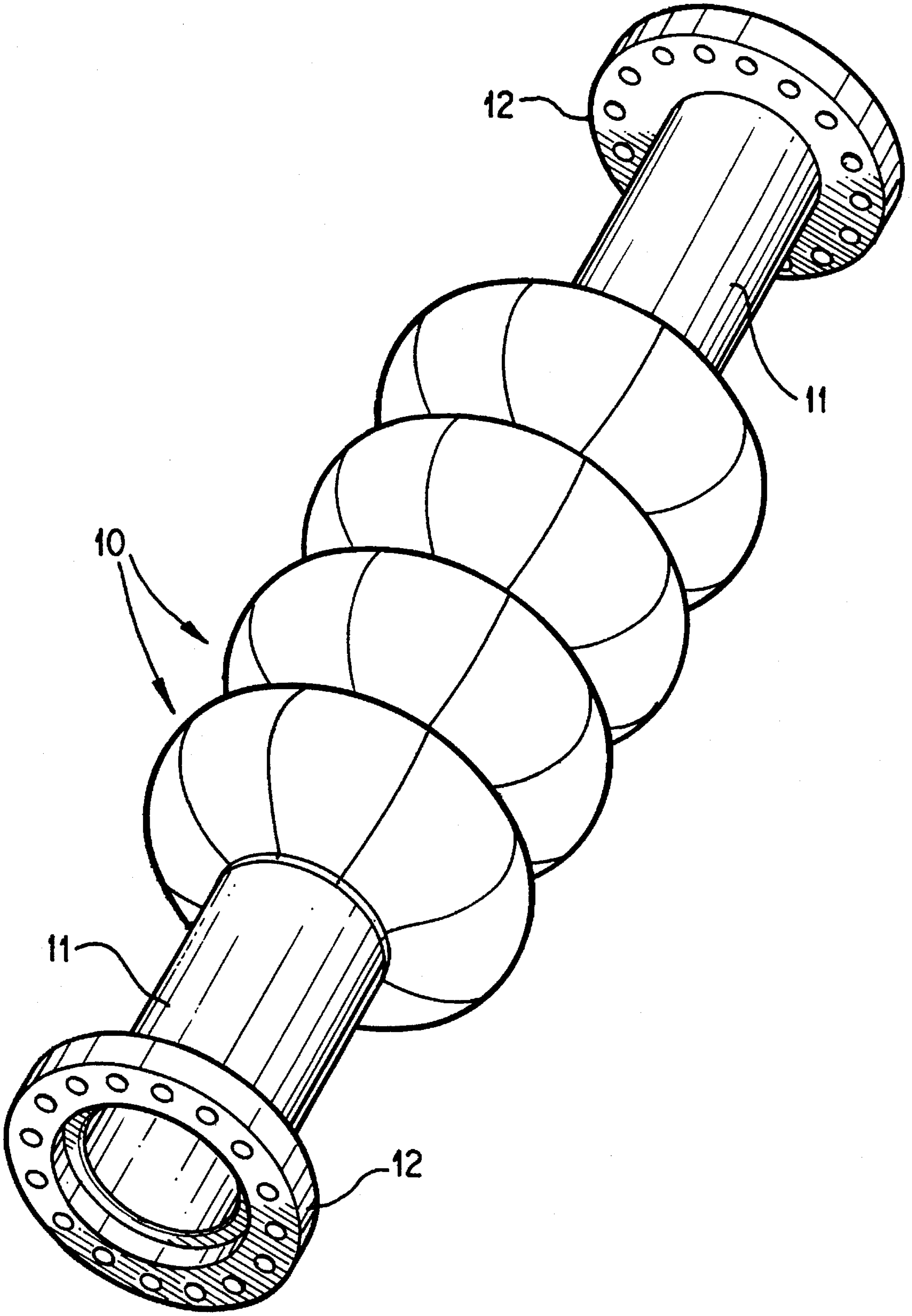
FIG. 1 shows schematically a multi-cell cavity of the prior art.

With reference to FIG. 1 a multi-cell cavity according to the prior art consists of a plurality of side by side cavities 10 carrying at the ends cylinders 11 terminating with UHV flanges indicated at 12.

In case the body of the resonator is of bulk niobium or OFHC copper, the present well established fabrication technique consists in lathe spinning or forming half cells which are then chemically and/or electrochemically polished and welded together by electron beam welding. At last, the multi-cell module is coupled to flanges 12 by brazing or even by electron beam welding. It is preferred that above all copper is electron beam welded from the interior of the resonator, since the welding from the exterior, if it does not completely penetrate through the thickness of the material, can produce microslots along the welding seem which are not even healed by the socalled "cosmetic welding".

Welding from the interior is, however, a severe limitation when building higher frequency cavities having lesser size. In case of welding OFHC copper to thin film Nb/Cu cavities, additional problems are implied. In fact, the quality of the covering, its superconducting property and the radiofrequency performance can be seriously compromised not only by the presence of craters or protrusions created by the electron beam, but also by void bubbles in the weld which are invisible after welding but appear during the chemical treatment of the cavity. It results from the foregoing that a monolithic cavity, i.e. a weldless cavity, represents doubtless a concrete step forward to the improvement of the final resonator performances.

Prototypes of weldless cavities have been already developed. Literature teaches that two techniques have been investigated, i.e. electroforming and hydroforming. Electroforming is applied only to copper and has the drawback to not keep under control the oxygen content of copper. This can be a severe limitation for the niobium sputtering since the oxygen impurities can migrate to niobium during the growth of the film.

Swelling by hydroforming is a technique which can be applied both to copper and niobium for resonators in all frequency ranges. In order to avoid cracks or anomalous buckling of the material, at least two annealings of the product are necessary to normalize stresses again after each swelling. The number of annealings is a function of the required final cavity form and the number of hydraulic deformation steps. Because of the quite expensive equipment, such technique is convenient only for a large number of resonators.

Figure 2A:
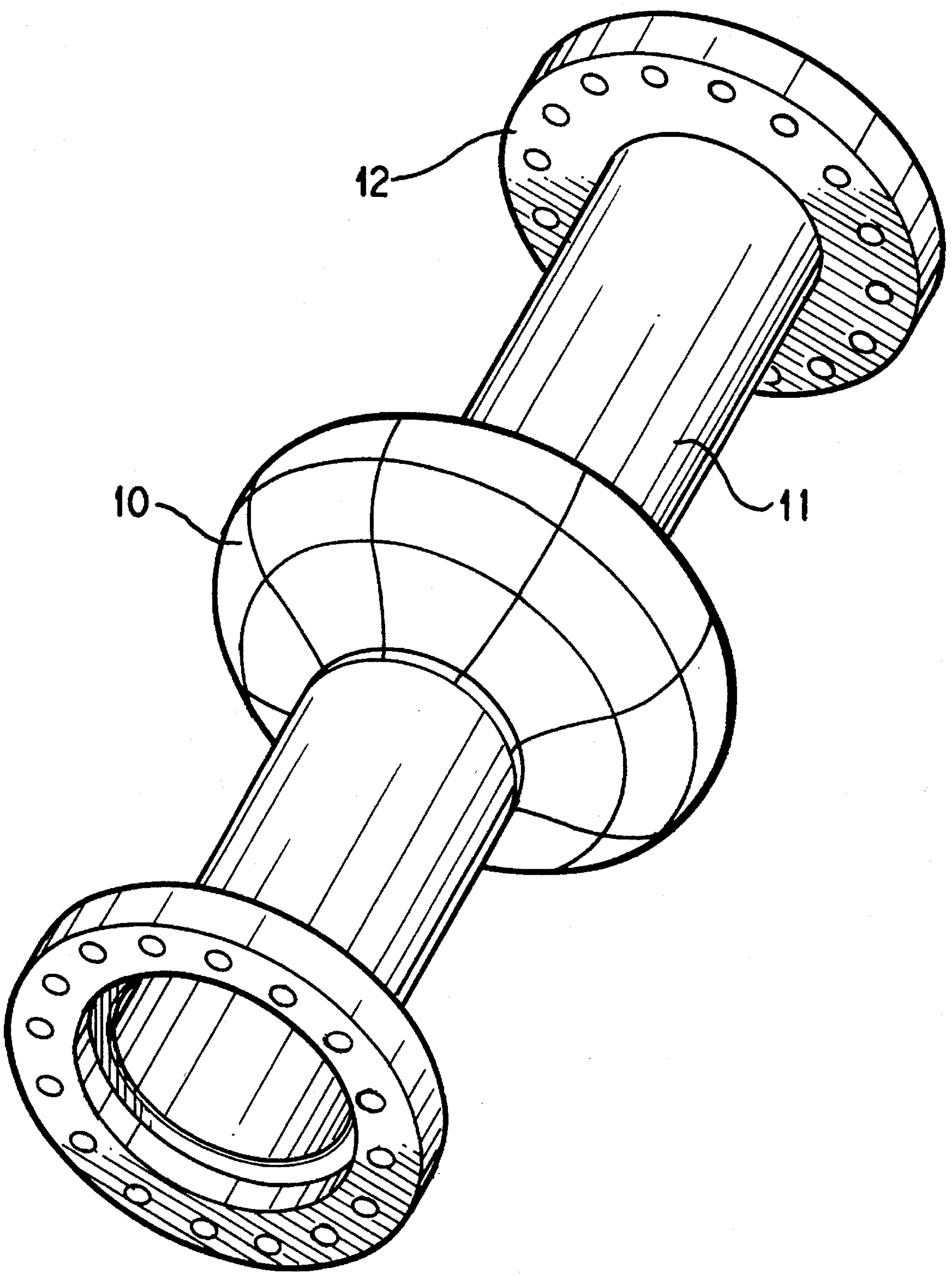
FIG. 2A shows a single cell cavity resonating at the frequency of 1.5 GHz.
Figure 2B:
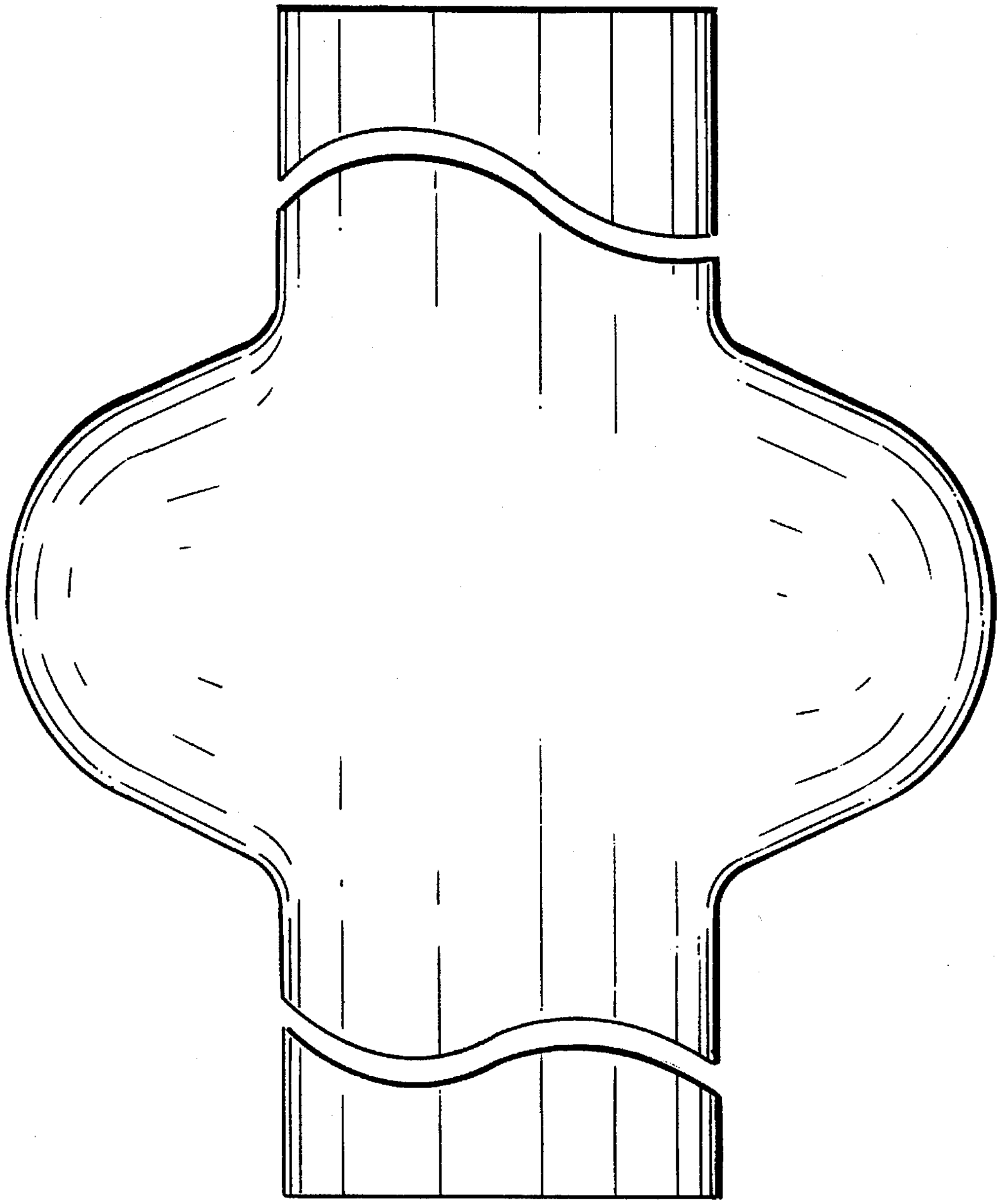
FIG. 2B shows the dimension of the interior of the cavity of FIG. 2A.

The present invention allows mono-cell cavities of copper or niobium resonating at 1.5 GHz to be fabricated by simply extrapolating the half cell spinning technique to the development of the whole cavity onto a suitable die. Cavities having a ratio of 2.27 between maximum and minimum diameter have been produced by such technique with low roughness on the internal surface. One of said cavities is shown, by way of example, in FIGS. 2A and 2B. As can be seen, the cut-off tube has a diameter of 80 mm and an equatorial diameter of 181.9. The bending radius in FIG. 2B will of course vary as such diameters change.

One of the major advantages of the invention is that it does not need large investments for expensive and sophisticated equipment such as those used for hydroforming.

The whole cavity complete with cut-off tubes can be spun from a 3 mm thick OFHC copper foil in a two-step spinning process with one intermediate vacuum annealing. A niobium foil with a thickness of about 100 microns and a 1 mm thick coating of electrodeposited copper or silver may be used instead.

The first step of the process is the spinning of the sheet onto a die having the shape of a frustum of cone, the smallest section of which has the same size as the cut-off tube. Of course, the angle of the frustum of cone should be related to the size of the cell to be formed. A copper or niobium disk clamped between the lower die surface and the lathe mandrel is easily deformed into a frustum of cone.

A second die (FIG. 3) having exactly the internal form of the cavity is used for the subsequent step of spinning a cut-off tube of the cavity together with a first half cell. A fast annealing at a temperature of the copper lower than 600° C. allows the spinning of the residual half cell and the second cut-off tube.

Figure 3:
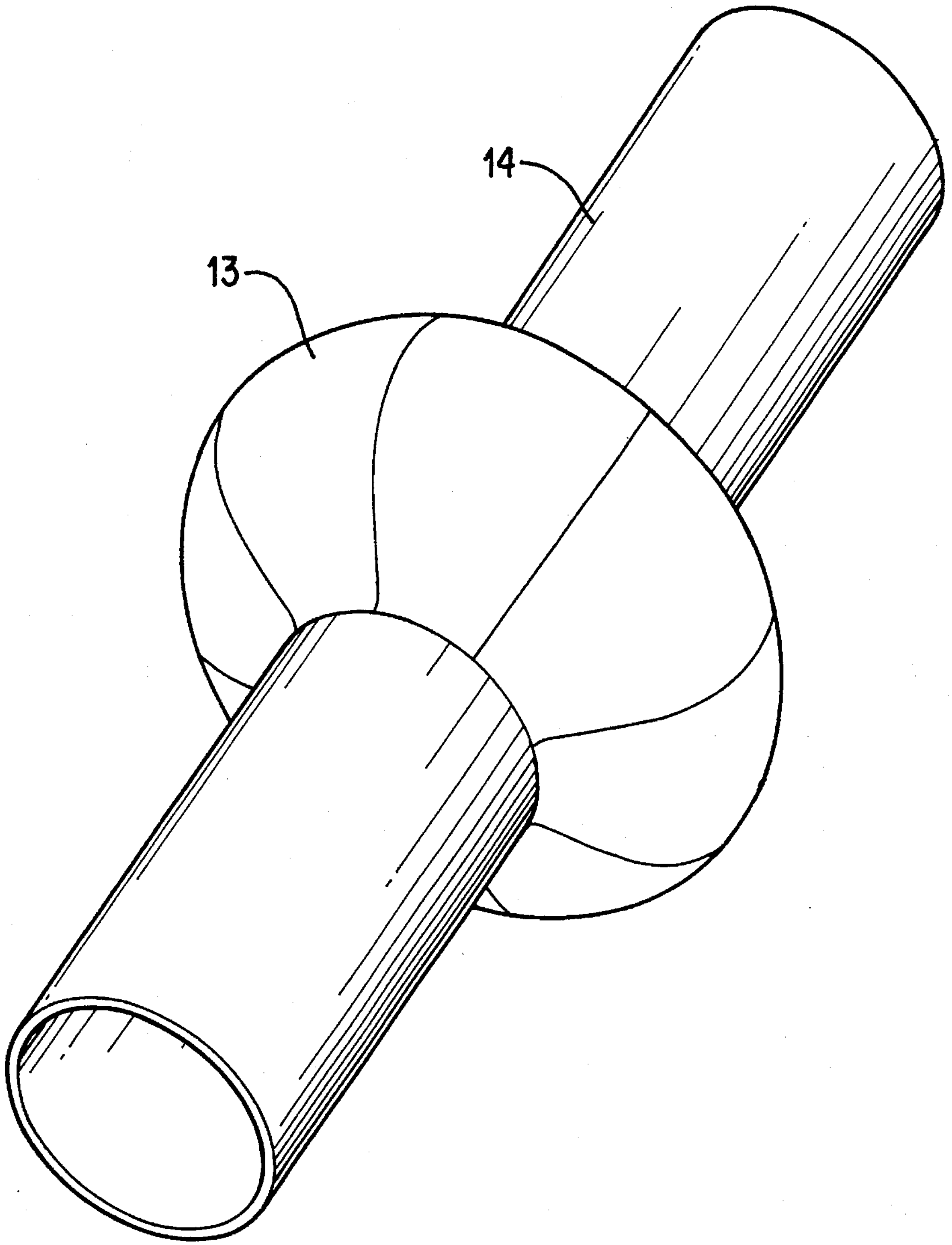
FIG. 3 shows the die for carrying out the method.
Figure 4:
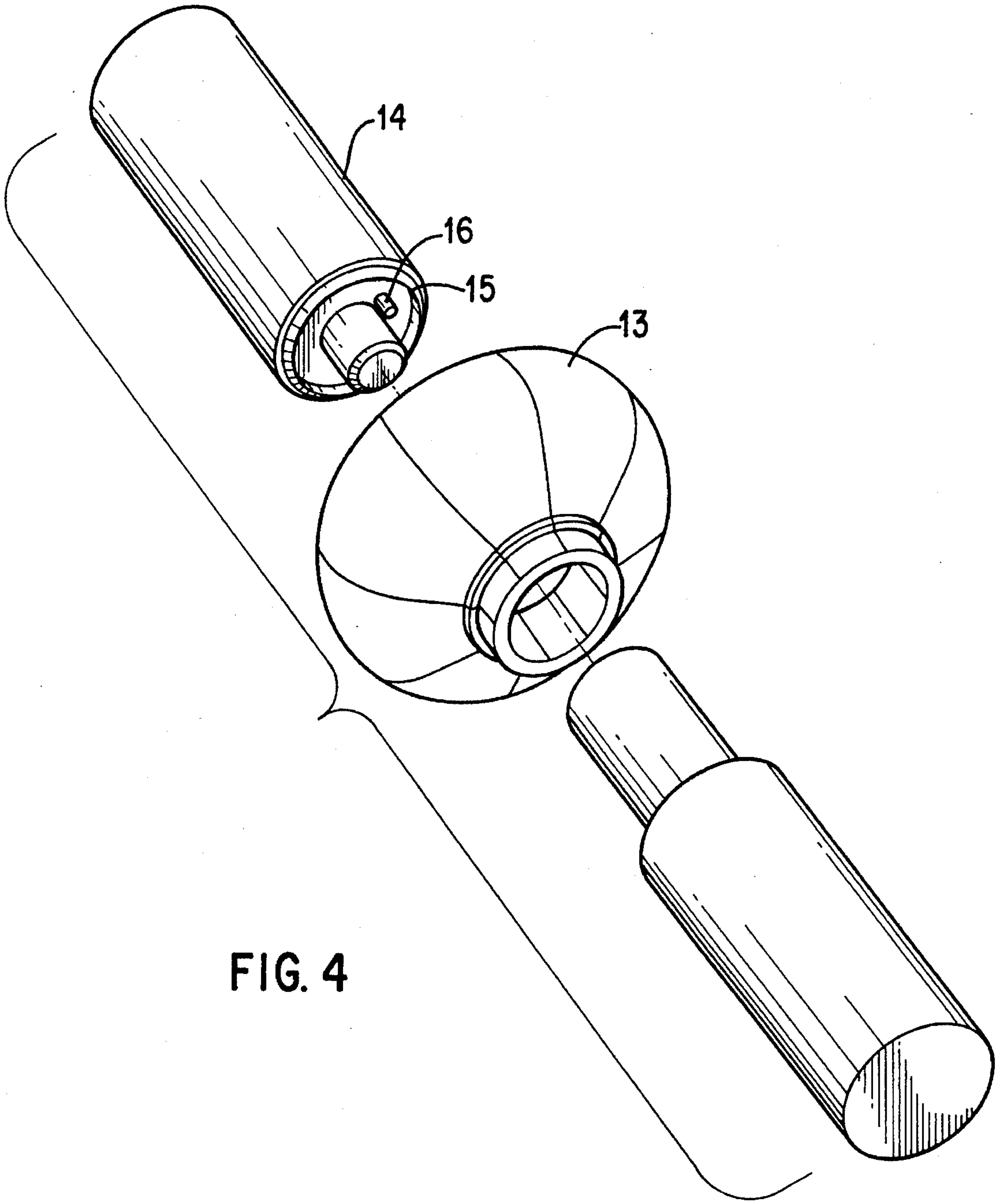
FIG. 4 shows the die of FIG. 3 disassembled in three parts.

The die of FIG. 3 is composed of three main pieces: a nylon or PVC shell on which the cavity belly is spun, and two stainless steel cylinders 14 on which the two cut-off tubes are formed (FIG. 4). Alternatively, the cylinders may also be made of PVC.

Figure 5A:
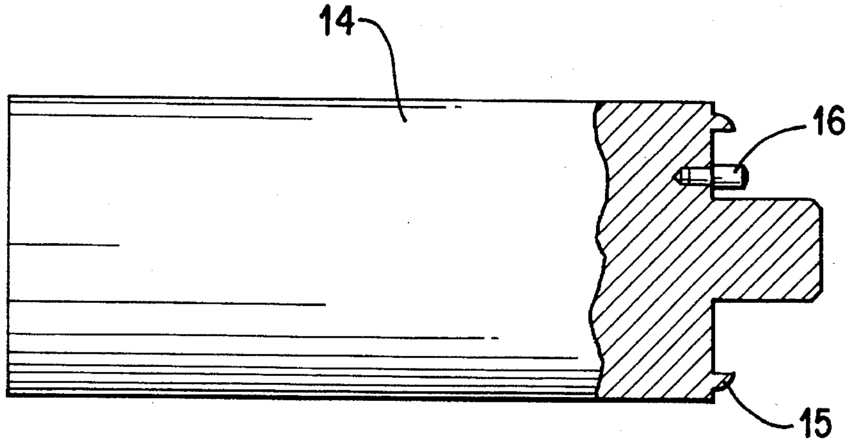
FIGS. 5A and 5B show the detail of the two end cylinders of FIG. 4.
Figure 5B:
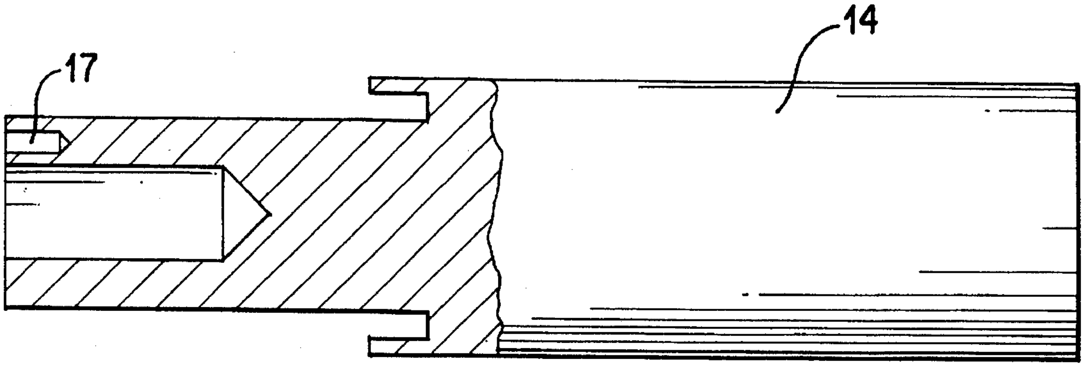

There is a conical coupling 15 between one cylinder and the shell to allow an easier disassembling of the die pieces (FIGS. 5A and 5B). Such coupling includes pin 16 carried by one cylinder and introduced into seat 17 of the other cylinder.

The die should be lubricated with lubricating oil which should then be removed by ultrasound treatment in a suitable bath to take the grease off.

Figure 6:
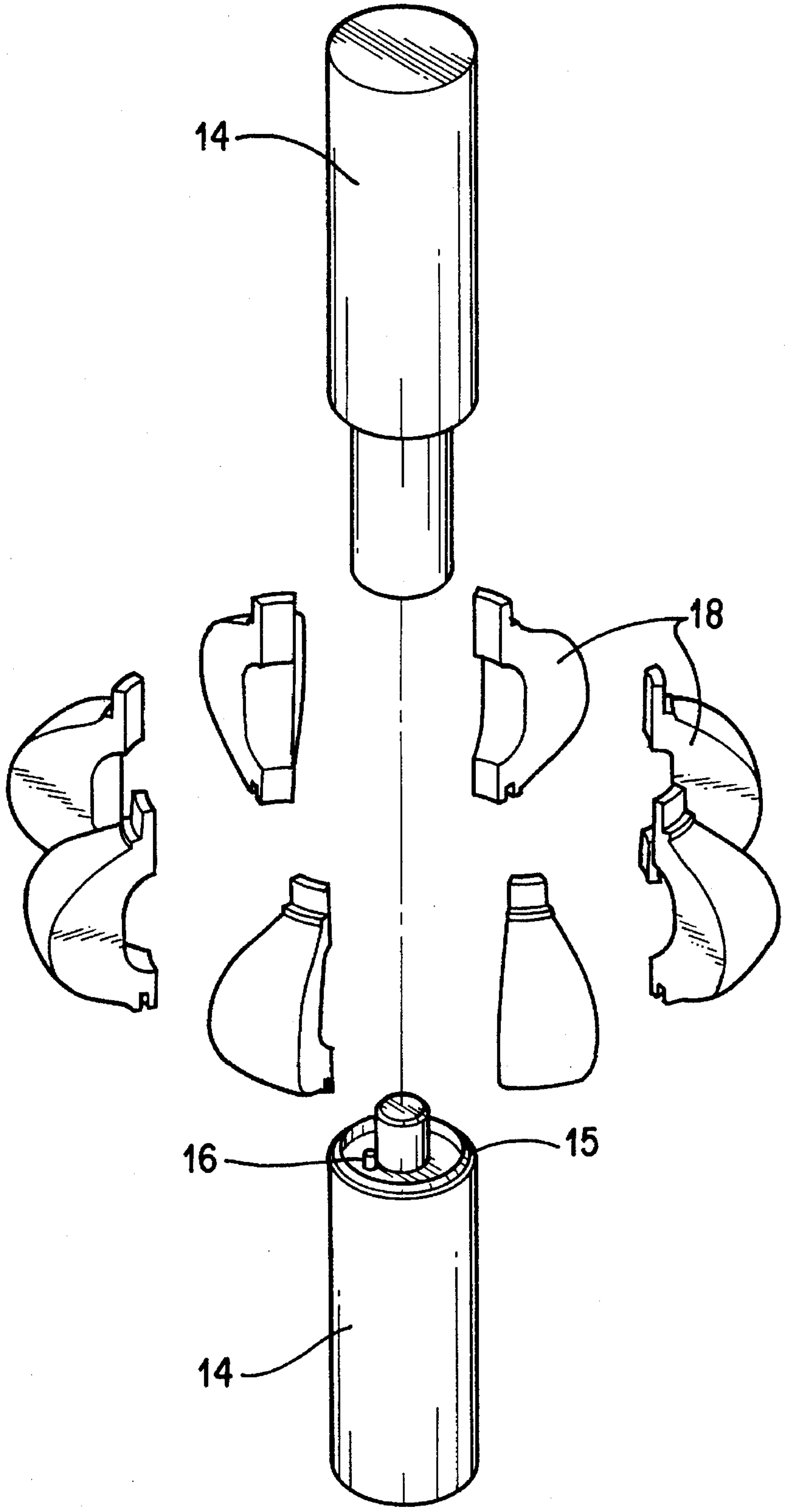
FIG. 6 shows the central shell of the die divided into sectors or slices.

In order to remove plastic shell 13 from the cavity after its fabrication, such shell is composed of ten sectors 18 shown in FIG. 6 and blocked together by the two steel cylinders 14 during the machining. Sectors 18 are cut simmetrically with respect to a longitudinal plane so as to form five pairs of opposite, equal sectors. Two opposite sectors operate as keys so that, once extracted from the resonator, all the others will become free to be removed too without effort. The shape of such keys is absolutely crucial, since it is impossible to extract them from the cavity if they are too large, while two keys are not enough if they are too small.

Figure 7B:
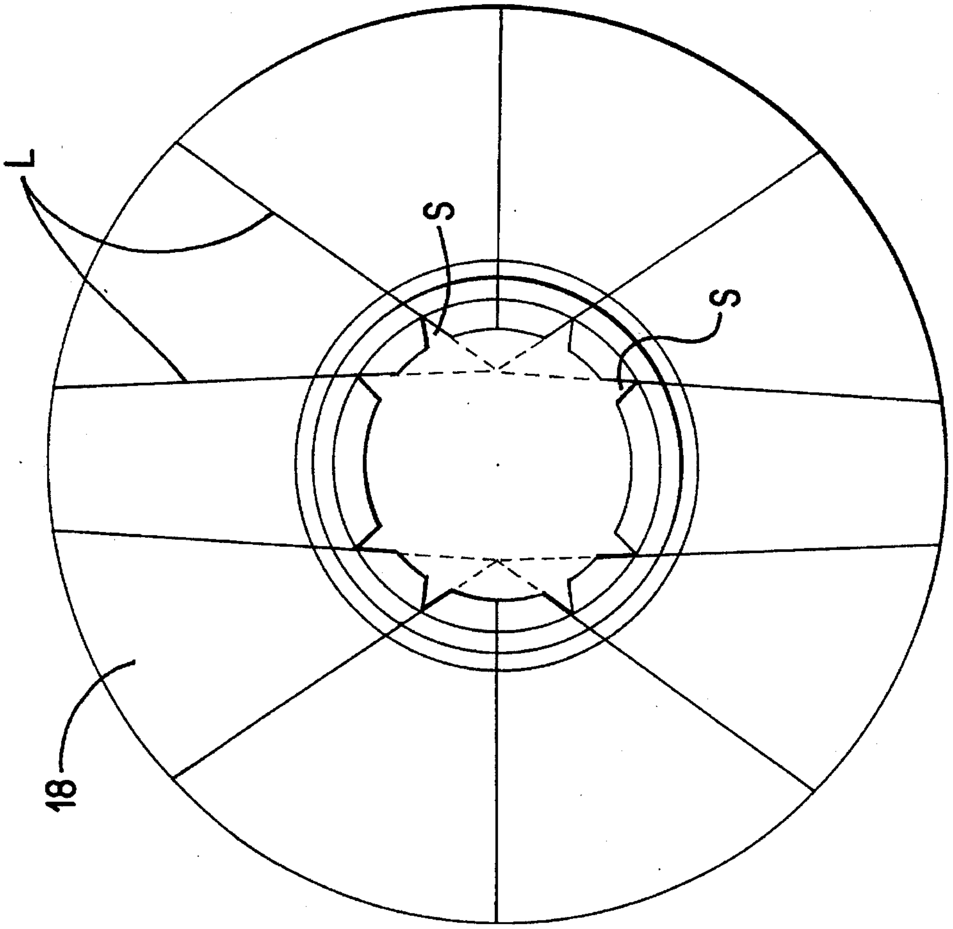
FIGS. 7A and 7B show a vertical section of the ring and the plan view of the sliced shell with the inner corner to be bevelled.
Figure 7A:
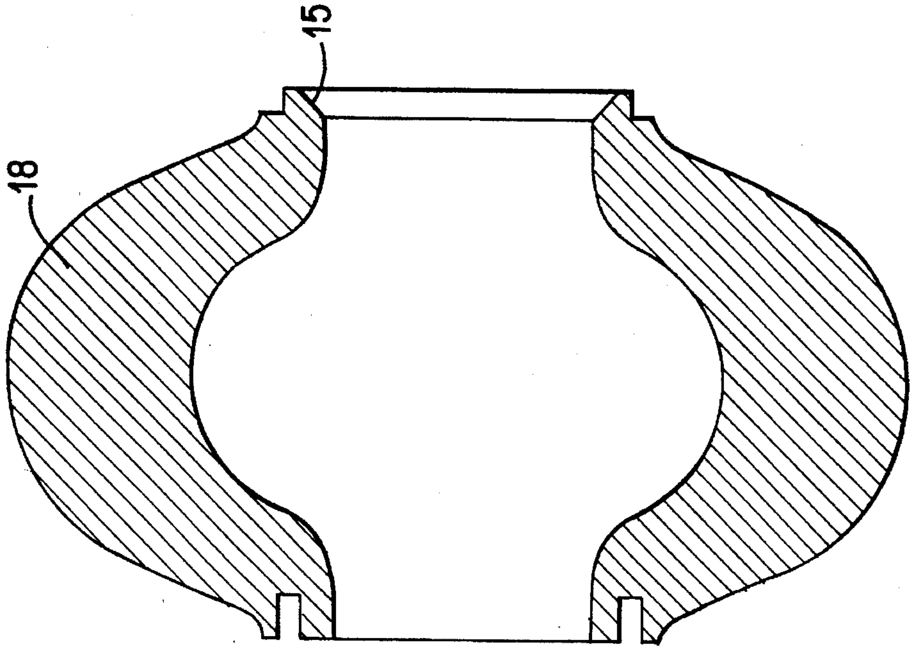

FIG. 7 shows sectors 18 and cutting lines L dividing the spun nylon shell 13 into slices. Of course, the shell should be cut into sectors when it is not yet finished to make machining easier. After the shell is cut into sectors the whole piece is blocked to a lathe at the steel cylinders and is machined until it takes on the final form of the cavity. After the end of the machining, the sectors should be bevelled at S as shown in FIG. 7B.

The Applicant has also considered alternative solutions to the use of a composite plastic shell. The shell indeed can be a single bulk piece not divided into sectors. If it is made of organic fiber or resin of suitable hardness and consistency, it is possible to chemically dissolve it by using solvents. The possibility of removing the plastic shell by destroying it by lathe has been tested, but it is not advisable because of the considerable expense besides the risk to damage the internal surface of the resonator by the cutting tool.

Weldless copper cavities spun from a 3 mm thick foil and niobium cavities spun from 1.5 mm thick foil have been prepared by the described technique. Further investigation is needed for niobium because of the problem of the socalled "orange peeling" which can be overcome by a suitable annealing.

It should also be noted that the quality of the surface strictly depends on the initial state of the surface of the starting material. By using an undamaged foil without scratches, the requested surface roughness can be obtained.

It should be appreciated that cavities of any frequency can be fabricated with the described method by simply changing the dimension. In addition, wherever there are equipment for fabricating spun half cells, the described method can be used without any substantial change.

In recent years superconducting materials at crucial temperature higher than that of niobium have been investigated for use in accelerating superconducting cavities. Crystal structure materials of the type A15 (for example, $V_3Si$, $Nb_3Sn$ $(NbTi)_3Ge$ . . . ) or of the type B1 (for example, NbNC, NbTiNC, NbZPN . . . ) are good examples. Such materials can be deposited by sputtering (cathode sputtering) onto an OFHC copper layer, or a cavity can be formed into the base metal, for example, vanadium, niobium, niobium-titanium or niobium-zirconium by the method described above. Then a thermal diffusion process, for example in nitrogen or methane atmosphere in case of compounds B1, or in silane or evaporated tin atmosphere in case of compounds A15, can take place.

Figure 8:
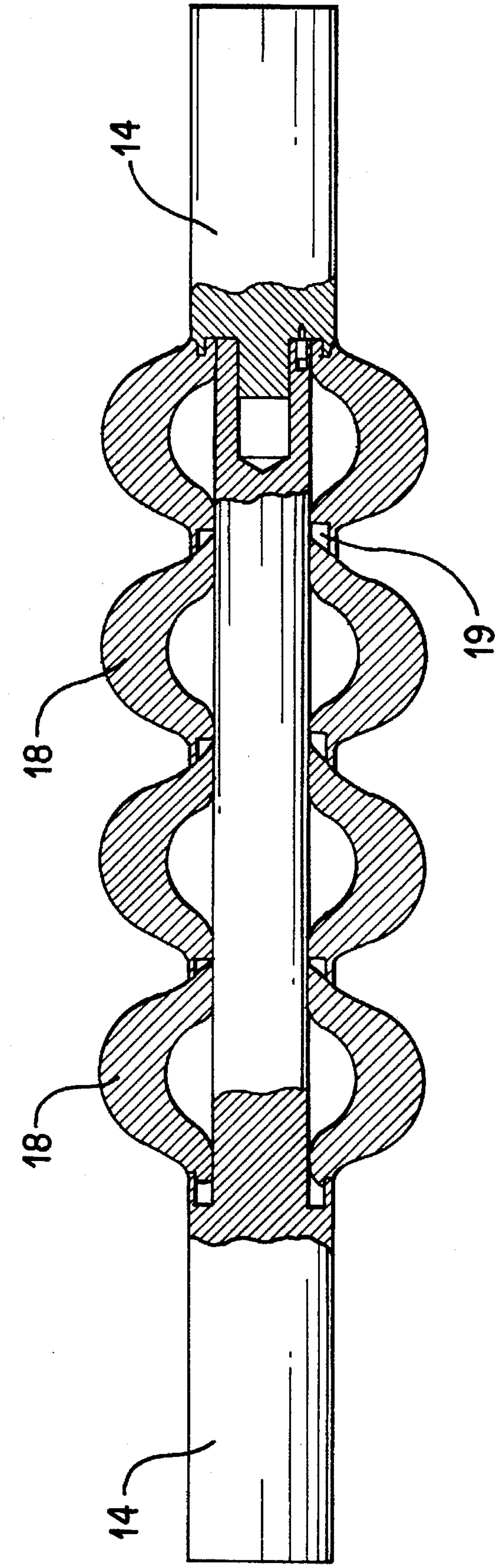
FIG. 8 shows a section of a modular die for multi-cell cavities according to the present invention.

The method of the present invention allows also multi-cells to be fabricated. For example, in case of fabrication of a four-cell cavity, the same technique can be used by employing a four-shell die, one for each cell. Each shell is equal to that of the die used for the mono-cell and is cut into sectors 18 as in FIG. 8. Each shell of the die is connected end to end to the successive shell and is provided with suitable bevellings 19 allowing sectors 18 to be removed. The coupling to the steel cylinders is the same as that of the mono-cell. The multi-cell cavity can be formed on a die by using a foil from which a frustum of cone or a cylinder is provided as described in the case of the mono-cell, or a drawn cylinder closed at one end can be used.

The present invention has been illustrated and described according to a preferred embodiment thereof but it should be understood that modifications can be made by a skilled in the art without departing from the scope of the present invention.

We claim:

1. A method of producing a weldless radio-frequency resonating cavity, comprising the steps of: spinning a disc-shaped foil on a frustum shaped die to form said foil into a frustum shape, said frustum die and said frustum shaped foil having an end having a first diameter and an opposite end having a second diameter, said first diameter being smaller than said second diameter; providing a cavity die which can be disassembled and which has the form of the resonating cavity; clamping said cavity die between two cylinders having the form of radio-frequency cut-off tubes, said cylinders each having a diameter approximately equal to said first diameter; placing said frustum shaped foil on said cavity die so that said first end of said frustum shaped foil is adjacent a free end of one of said cylinders; spinning said frustum shaped foil by using said cavity die together with the cylinders until a monolithic foil body consisting of a resonating cavity disposed between two cut-off tubes covers the die and said cylinders; and removing said cavity die from within said monolithic foil body by disassembling said cavity die.

2. The method of claim 1 wherein the shape of said frustum die and said formed frustum shaped foil is such that said frustum shaped foil will encompass said cavity die and said cylinders.

3. The method of claim 2 wherein an annealing step is performed at a temperature of less than 600° C. while said frustum shaped foil is being spun on said cavity die and the other of said two cylinders.

4. The method a claim 1, characterized in that the foil material is OFHC copper on which a niobium coating is sputtered.

5. A method of producing a weldless radio-frequency resonating cavity, comprising the steps of: providing a cavity die which can be disassembled and which has the form of the resonating cavity; clamping said cavity die between two cylinders having the form of radio-frequency cut-off tubes, said cylinders being connected to said cavity die by conical coupling surfaces cooperating with a pin carried by one cylinder and introduced into a seat of the other cylinder; spinning a foil by using the cavity die together with the cylinders until a monolithic foil body consisting of a resonating cavity disposed between two cut-off tubes covers the cavity die and said cylinders; and disengaging said cavity die by disassembling the cavity die.

6. The method of claim 5 wherein said cavity die is comprised of a plurality of sectors, each sector including a pair of planar surfaces which, when said cavity die is assembled, are disposed in respective planes which pass through a central longitudinal axis of said cavity die, each of said sectors being sized so that upon being disengaged they may be removed through said cut-off tubes of said monolithic foil body.

7. A method of producing a pair of interconnected weldless radio-frequency resonating cavities, comprising the steps of: providing a pair of interconnected cavity dies each of which can be disassembled and which has the form of a resonating cavity, each of said cavity dies comprising a plurality of sectors, each sector having a pair of planar surfaces which, when said cavity dies are assembled, are disposed in respective planes which pass through a central longitudinal axis of said cavity dies; clamping said pair of cavity dies between two cylinders having the form of radio-frequency cut-off tubes; spinning a foil by using the dies together with the cylinders until a monolithic foil body consisting of a pair of resonating cavities disposed between two cut-off tubes covers the cavity dies and cylinders; and removing said cavity dies from within said monolithic foil body by disassembling said cavity dies and removing said sectors through said cut-off tubes of said monolithic foil body.

* * * * *